US00RE38550E1

(19) United States
(12) Reissued Patent
Richiuso

(10) Patent Number: US RE38,550 E
(45) Date of Reissued Patent: Jul. 6, 2004

(54) METHOD FOR PROGRAMMABLE INTEGRATED PASSIVE DEVICES

(75) Inventor: Dominick L. Richiuso, Saratoga, CA (US)

(73) Assignee: California Micro Devices, Inc., Milpitas, CA (US)

(21) Appl. No.: 09/817,961

(22) Filed: Mar. 26, 2001

Related U.S. Patent Documents

Reissue of:
(64) Patent No.: 5,998,275
Issued: Dec. 7, 1999
Appl. No.: 08/953,350
Filed: Oct. 17, 1997
(60) Provisional application No. 60/028,778, filed on Oct. 18, 1996.

(51) Int. Cl.[7] ..... H01L 21/8256
(52) U.S. Cl. ..... 438/381; 438/239
(58) Field of Search ..... 438/238, 239, 438/381, 382; 257/390–391, 532–535

(56) References Cited

U.S. PATENT DOCUMENTS

| | | | | |
|---|---|---|---|---|
| 4,219,836 A | | 8/1980 | McElroy | 357/55 |
| 4,682,402 A | | 7/1987 | Yamaguchi | 29/571 |
| 4,890,191 A | | 12/1989 | Rokos | 361/313 |
| 5,120,572 A | | 6/1992 | Kumar | 437/60 |
| 5,294,837 A | * | 3/1994 | Takase et al. | 257/207 |
| 5,310,695 A | | 5/1994 | Suzuki | 437/60 |
| 5,530,418 A | | 6/1996 | Hsu et al. | 338/307 |
| 5,635,421 A | | 6/1997 | Ting | 438/396 |
| 5,777,839 A | | 7/1998 | Sameshima et al. | 361/311 |
| 5,817,533 A | | 10/1998 | Sen et al. | 438/4 |
| 5,872,040 A | | 2/1999 | Wojnarowski et al. | 438/393 |
| 5,872,697 A | | 2/1999 | Christensen et al. | 361/313 |

FOREIGN PATENT DOCUMENTS

GB 2290917 A 10/1996 ..... H03H/19/00

OTHER PUBLICATIONS

Notification of Transmittal of the International Search Report, International Searching Authority, Jul. 8, 1998.
European Search Report transmitted by the EPO on Dec. 20, 1999.

* cited by examiner

*Primary Examiner*—Jey Tsai
(74) *Attorney, Agent, or Firm*—Pillsbury Winthrop LLP

(57) ABSTRACT

A method for endowing an integrated passive device array structure with a programmable value during manufacturing. The method includes forming a substantially conductive first layer and forming a plurality of passive device array elements of the integrated passive device array structure above the substantially conductive first layer. The method further includes forming an insulating layer above the plurality of passive device array elements. There is further included selectively forming vais the insulating layer. The vias facilitate electrical connections between selected ones of the plurality of passive device array elements with a substantially conductive second layer subsequently deposited above the insulating layer.

14 Claims, 6 Drawing Sheets

N+
30

32
P - PPI
N+
30

34
P -
N+
P -
N+
30

FIELD OXIDE
36
P-
N+
36
34
36
P -
N+
30

METHOD FOR PROGRAMMABLE INTEGRATED PASSIVE DEVICES

Matter enclosed in heavy brackets [ ] appears in the original patent but forms no part of this reissue specification; matter printed in italics indicates the additions made by reissue.

*CROSS-REFERENCE TO RELATED APPLICATIONS*

*This patent application claims priority from U.S. Provisional Patent Application No. 60/028,778 filed Oct. 18, 1996.*

BACKGROUND OF THE INVENTION

The present invention relates to the manufacture of integrated circuits (IC's). More particularly, the present invention relates to programmable capacitors, and methods therefor, that render the value of the capacitor selectable during manufacturing.

Integrated circuits integrate many discrete functions and components into one "integrated" circuit. One of the reasons integrated circuits presently predominate over discrete component solutions is because of the costs involved in manufacturing, assembling, and testing discrete based circuits. For example, present day microprocessors incorporate more than one million transistors into a square package less than 5 cm on each side. The same number of transistors, discretely and separately placed on a printed circuit board, would require several orders of magnitude more space. Other advantages of integrated circuit technology, which are well known to those skilled in the art, include reliability and cost.

The miniaturization that present day integrated circuit technology, and the benefits that such technology bestows, are applicable to passive component integration as well. When passive devices, e.g., capacitors, resistors, inductors, and the like, are integrated, they are referred to herein as passive component integrated circuits.

In the design of passive thin film integrated circuits, for example, capacitors of different values are needed. By way of example, in the design of a family of filters or terminators, resistors and capacitors are combined in different configurations and values to provide different functionality and performance. In prior art, this is typically accomplished by a custom design and integrated circuit layout configuration for each type of circuit and for each value. This process is time consuming, more prone to errors and less economical.

In the description that follows, an integrated capacitor is selected for discussion. It should be borne in mine, however, that the inventive concepts herein also apply to other types of passive devices, e.g., resistors, inductors, and the like. In the prior art, when an application requires an integrated capacitor having a value that is previously unavailable, a new custom design is necessitated to create an integrated circuit having a capacitor with the desired value. This custom design approach requires a substantial amount of time, effort, and expense since a custom design with specific capacitance values and characteristics must be laid out and verified, the required masks must be created, and manufacturing steps must be tailored to fabricate the required integrated circuits. As can be appreciated from the foregoing, the custom design approach is disadvantageous in view of the great variety of device values required by modern electronic equipment.

In view of the foregoing, what is desired are passive component integrated circuit structures and methods therefor, which can implement a wide range of values in a given single design. This alleviates all the above mentioned limitations of prior art custom design approaches, thereby providing quicker design turnaround time, fewer design errors and a lower manufacturing cost.

SUMMARY OF THE INVENTION

The present invention relates, in one embodiment, to a method for endowing an integrated passive device array structure with a programmable value during manufacturing. The method includes forming a substantially conductive first layer and forming a plurality of passive device array elements of the integrated passive device array structure above the substantially conductive first layer. The method further includes forming an insulating layer above the plurality of passive device array elements. There is further included selectively forming vias in the insulating layer. The vias facilitate electrical connections between selected ones of the plurality of passive device array elements with a substantially conductive second layer subsequently deposited above the insulating layer.

In another embodiment, the invention relates to a method for forming an integrated passive device array structure having a programmable value. The method includes forming a substantially conductive first layer, and electrically coupling the substantially conductive first layer with a plurality of passive device array elements of the integrated passive device array structure. The plurality of passive device array elements is disposed above the substantially conductive first layer. There is also included electrically coupling selected ones of the plurality of passive device array elements with a substantially conductive second layer to form the integrated passive device array structure. The selected ones of the plurality of passive device array elements represent a subset of the plurality of passive device array elements.

In yet another embodiment, the invention relates to an integrated programmable passive device array structure, which includes a first node, and a plurality of passive device array elements electrically coupled to the first node. The integrated programmable passive device array structure further includes a second node electrically coupled, in a selective manner, to selected ones of the plurality of passive device array elements. The selected one of the plurality of passive device array elements represent a subset of the plurality of passive device array elements, wherein a value of the programmable passive device array structure is substantially determined by an aggregate of values of the selected ones of the plurality of passive device array elements.

In another embodiment, the invention relates to a capacitor array structure having multiple capacitor array elements. During production, the individual capacitor array elements are selected for inclusion into or exclusion out of the final capacitor structure. An included capacitor array element contributes its capacitance value to the capacitance value of the final capacitor structure. In contrast, the capacitance value of an excluded capacitor array element makes no contribution to the capacitance value of the final capacitor structure.

In another embodiment, the capacitor array elements are binary related, in accordance with this embodiment, a given array element has twice the capacitance value of its smaller counterpart. For example, the cell surface area of a successive capacitor array element increases by a factor of 2 relative to its immediately smaller counterpart. Because capacitance is proportional to the surface area of the plates forming the capacitor, by providing n distinct cells in the array structure, 2n different capacitance values may be available for each such array structure.

In accordance with yet another embodiment of the present invention, a given capacitor array element is selected for inclusion by providing it with a contact, thereby permitting an electrical path to exist between its plates and the nodes of the final capacitor structure through the provided contact. On the other hand, another given capacitor array element is excluded from the final capacitor structure when no contact is provided for it, thereby inhibiting the formation of an electrical path between its plates and the nodes of the final capacitor structure. In this manner, individual capacitor array elements of a capacitor array structure may be programmably selected for inclusion or exclusion by appropriately designing the contact mask.

These and other advantages of the present invention will become apparent upon reading the following detailed descriptions and studying the various figures of the drawings.

DESCRIPTION OF THE PREFERRED EMBODIMENT

In accordance with one aspect of the present invention, the value of the inventive programmable capacitor may be rendered selectable during manufacturing by fabricating the capacitor as a programmable capacitor array structure. The value of the capacitor that results may be programmably determined during manufacturing by the selective inclusion of individual capacitor array members. Capacitor array members which are incorporated into the final programmable capacitor array structure contribute to the capacitance value of the resulting capacitor. On the other hand, capacitor array members which are not incorporated into the final programmable array structure do not contribute to the capacitance value of that resulting capacitor. The above concept may be better understood with reference to the Figures below.

Figure 1A:
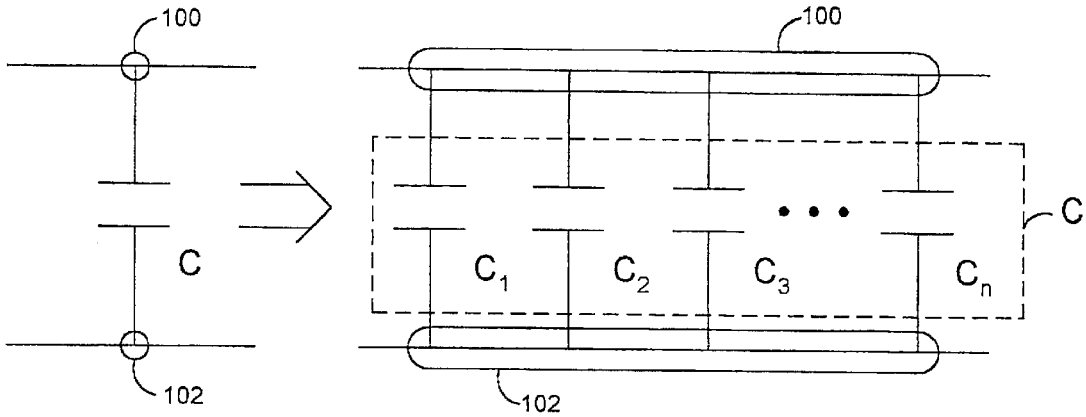
FIGS. 1(a) and 1(b) are a schematics illustrating, in accordance with one aspect of the present invention, capacitor array structures having capacitors coupled in parallel for implementing the programmable capacitors of the present invention.
Figure 1B:
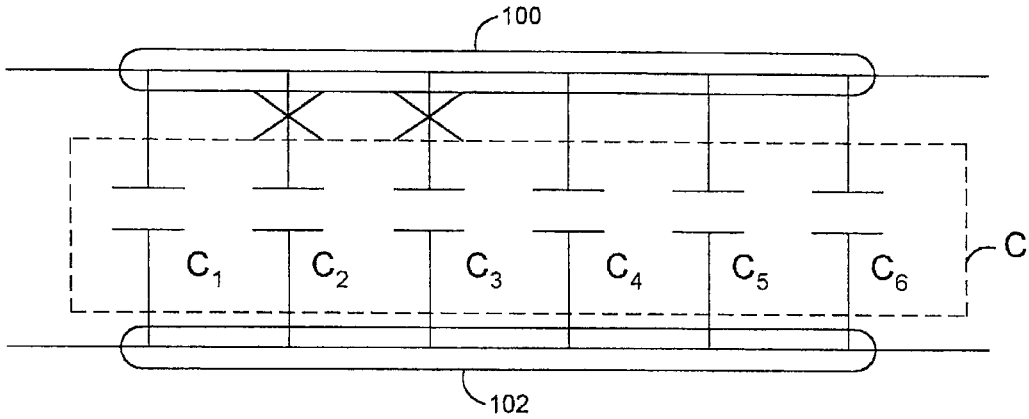
Figure 1C:
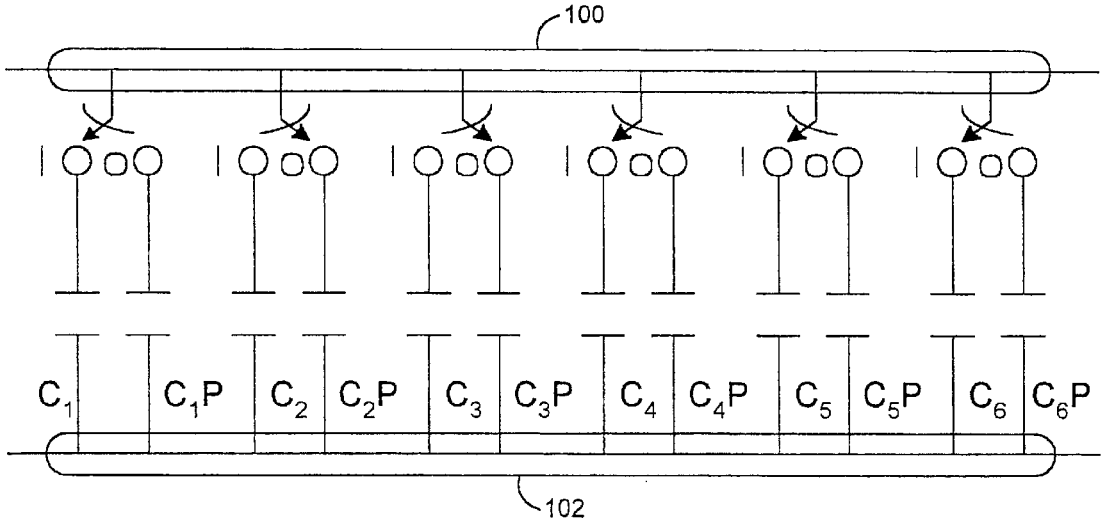
FIG. 1(c) is a symbolic circuit diagram illustrating the contribution made by selected and non-selected capacitor array members to the capacitance value of the final capacitor structure.

FIGS. 1(a) through 1(c) illustrate the concept that underlies the programmable capacitor array in accordance with one aspect of the present invention. FIG. 1a illustrates a programmable capacitor C, which comprises a plurality of programmably related capacitor array members, $C_1$, $C_2$, $C_3$ . . . $C_n$. The programmably related capacitor array members $C_1$, . . . $C_n$, are arranges such that each, if selected, may be coupled in parallel with others in the programmable capacitor array. As is readily recognizable by those skilled in the art, the effective capacitance value of the programmable capacitor array of FIG. 1a equals the cummulative capacitance value of the capacitor array members that are coupled to nodes 100 and 102 in paralleL In other words, the value of programmable capacitor C between nodes 100 and 102 is determined by which of capacitor array members $C_1$. . . $C_n$ are incorporated into the final capacitor structure.

In one embodiment, the capacitor array members $C_1$ through $C_n$ are related to one another in a binary manner. In other words, the values of the capacitor array members are successively increased by a factor of 2. In FIG. 1b, for example, there are shown a programmable capacitor array comprising six capacitor array members $C_1$ . . . $C_6$. When the capacitor array members $C_1$ . . . $C_6$ are binary related, capacitor array member $C_2$ has twice the capacitance value of capacitor array member $C_1$; capacitor array member $C_3$ has twice the capacitance value of capacitor array member $C_2$; and so on. It should be recognized that the capacitance value of a capacitor array member $C_m$ equals $2^{(m-1)}$ times the capacitance value of the smallest capacitor array member $C_1$ (m being an arbitrary integer between 1 and n, the total number of capacitor array members in the programmable capacitor array).

It should be noted that although binary related capacitor array members are discussed herein to facilitate ease of understanding, the capacitance values of the capacitor array members may be related to one another via any predetermined relationship. For example, the capacitance values among the capacitor array members may be related in accordance to a linear, geometric, logarithmic, or exponential relationship. Of course, they may also relate to one another in any other arbitrary, predefined manner.

In FIG. 1b, capacitor array members $C_2$ and $C_3$ are not incorporated into the final capacitor structure. As such, the capacitancevalue ofthe capacitor structure of FIG. 1b substantially equals to the sum of the capacitance values of capacitor array members $C_1$, $C_4$, $C_5$, and $C_6$(or $C_1+8C_1+16C_1+32C_1=57C_1$). Other capacitance values may be obtained, as can be appreciated from the foregoing, by selectively incorporating or removing the individual capacitor array members from the final capacitor structure.

Depending on the particular fabrication technology employed, the layout of the integrated circuit may, in some cases, give rise to parasitic capacitance between the layers in some structures. The parasitic capacitance associated with a given capacitor array member may contribute to the capacitance value of the final capacitor structure even if that particular capacitor array member is not incorporated into the final capacitor structure. To illustrate this concept, FIG. 1c symbolically illustrates the contribution of each included and excluded capacitor array member to the capacitance value of the final capacitor structure of FIG. 1b.

Referring to FIG. 1c, capacitor array member C1 is selected for incorporation. Accordingly, its capacitance value contributes to the resultant capacitance value of the final capacitor structure of FIG. 1b. In the context of FIG. 1c the incorporation of capacitor array member C1 is illustrated symbolically by the connection of capacitor C1 to nodes 100 and 102.

Capacitor array member $C_2$ is not selected for incorporation. Accordingly, its capacitance value does not contribute to the resultant capacitance value of the final capacitor structure of FIG. 1b. As shown in FIG. 1c, however, the parasitic capacitance value associated with capacitor array member $C_2$ still contributes to the capacitance value of the final capacitor structure. As a result, a parasitic capacitor $C_{2p}$ (where p denotes parasitic capacitance) is symbolically coupled to node 100 in FIG. 1c. Likewise, capacitor array member $C_3$ is not selected. As shown in FIG. 1c, the parasitic capacitor $C_{3p}$, which is associated with capacitor array member $C_3$, still makes its contribution to the capacitance value of the resultant capacitor structure.

Finally, capacitor array members $C_4$ and $C_5$ are selected for incorporation. As a result, their capacitance values contribute to the value of the capacitor structure that results, as shown in FIG. 1c. FIG. 1c is also useful for visualizing the programmable aspect of the inventive capacitor array structure. When a given capacitor array member is selected for incorporation into the final capacitor structure, its capacitor may be thought of as being coupled to a capacitor node (node 100 in the case of FIG. 1c) by a switch. When a given capacitor array member is not selected for incorporation into the final capacitor structure, its capacitor is not coupled to the capacitor nodes. Instead, the parasitic capacitor associated with the non-selected capacitor array member may then be thought of as being coupled to the capacitor nodes.

Figure 2:
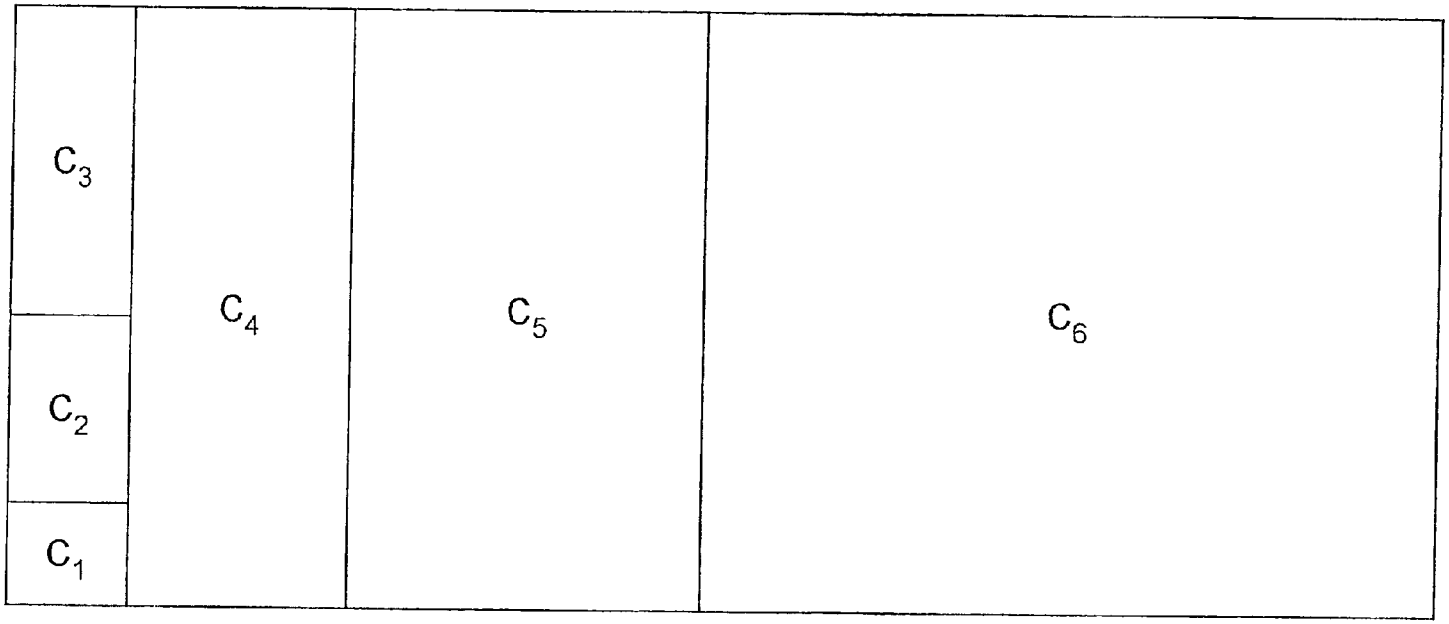
FIG. 2 shows, in accordance with one embodiment of the present invention, a top plane view of a capacitor array layout.

FIG. 2 illustrates, in accordance with one embodiment of the present invention, the layout of a programmable capacitor array. For ease of discussion, the capacitor array members of FIG. 2 are binary related although, as noted earlier, other relationships may well be employed.

As is well known, a capacitor is created by placing a dielectric medium of a certain thickness between two conductive regions, or plates, with the capacitance being directly proportional to the surface area of the plates in contact with the dielectric; directly proportional to the dielectric constant and inversely proportional to the dielectric thickness. In this manner, for a given dielectric constant and thickness, if the surface area is doubled, the capacitance is also doubled. In FIG. 2, the surface area of capacitor $C_2$ is twice that of capacitor $C_1$. Similarly, the capacitance of capacitor $C_3$ is twice that of capacitor $C_2$, and that of $C_4$ is twice that of capacitor $C_3$, and so on.

In accordance with one aspect of the present invention, every capacitor array member of a programmable capacitor array is fabricated, complete with its plates and dielectric layer irrespective of whether that capacitor array member is incorporated into the final capacitor structure. To select a capacitor array member for incorporation, a contact is created with a capacitor plate (typically but not necessarily the upper plate) to facilitate the formation of a conduction path between a common conductor and that capacitor plate. The common conductor represents a node of the final capacitor structure, e.g., node 100 of FIGS. 1a, 1b, and 1c. Consequently, the provision of a contact permits the selected capacitor array member to be coupled to the common conductor, and to the remainder of the resultant capacitor structure, in a parallel fashion with other selected capacitor array members.

If a capacitor array member is not selected for incorporation into the final capacitor array structure, no contact is provided for that capacitor array member. Consequently, there is no conduction path between the plate of that non-selected capacitor and the common conductor, and the capacitor array member is essentially "decoupled," electrically speaking, from the remainder of the resultant capacitor structure.

Figures 3A, 3B, 3C, 3D:
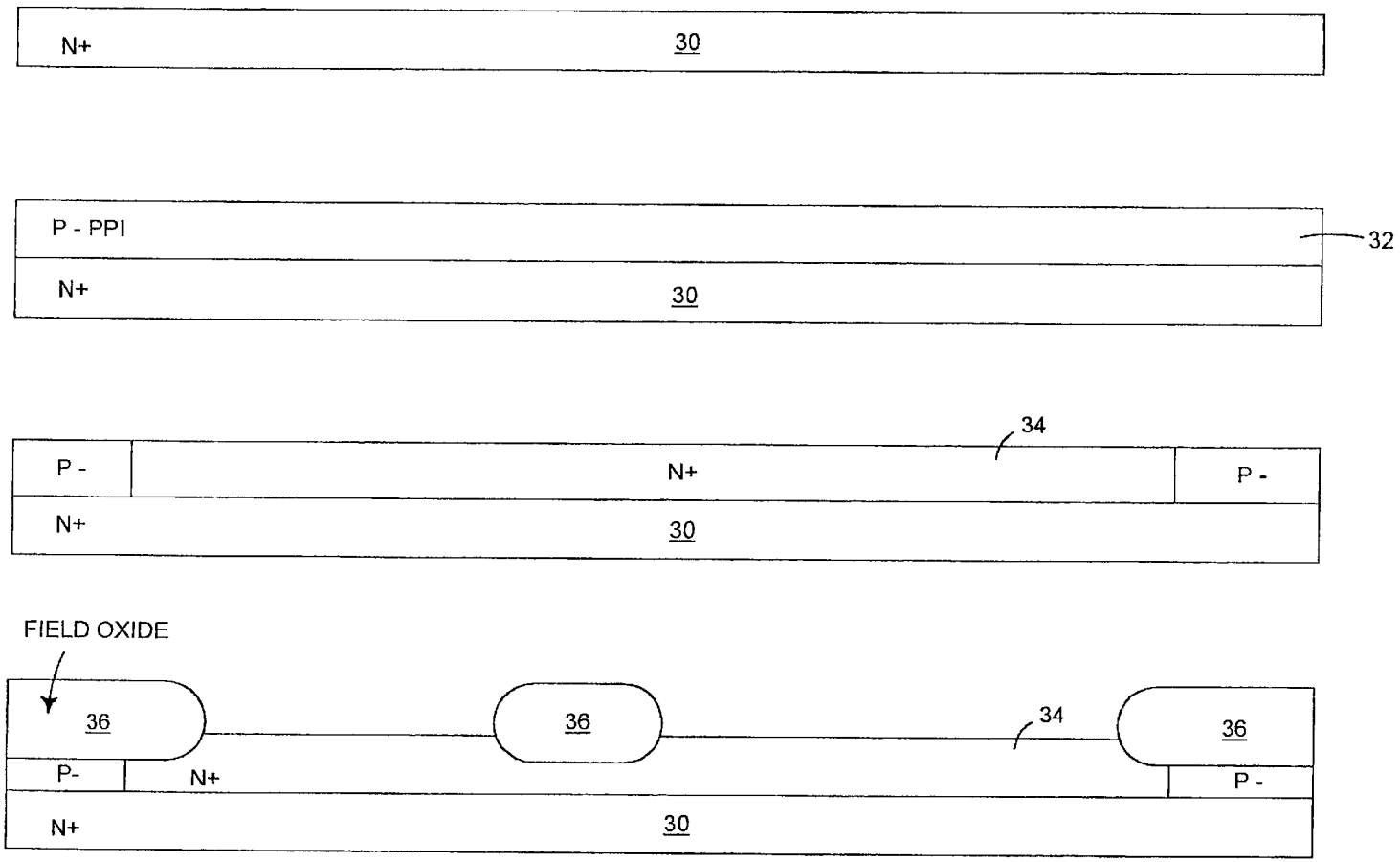
FIGS. 3a–3j illustrate, in accordance with one embodiment of the present invention, the relevant steps involved in the fabrication and programming of a capacitor array structure.
Figure 3E:
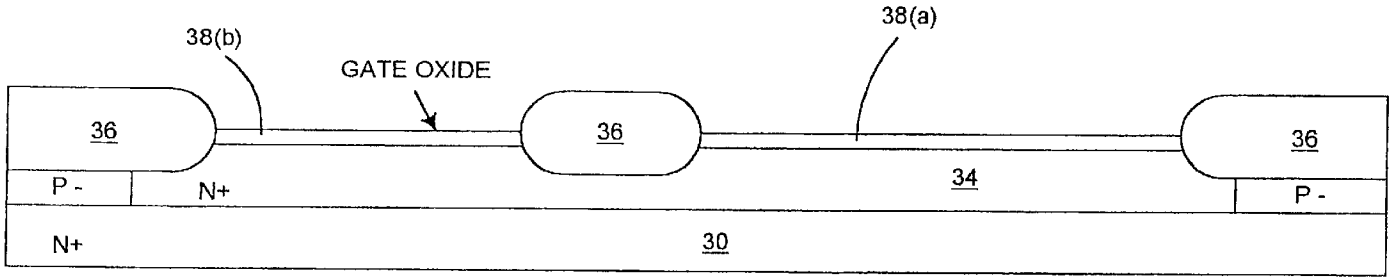

The above concept may be better understood with reference to FIGS. 3a–3j below. FIGS. 3a–3j illustrate, in accordance with one embodiment of the present invention, a manufacturing method whereby a programmable capacitor array is created and selected ones of the array's members are programmably incorporated into the final capacitor structure. FIG. 3a shows the process starting with an n+type substrate 30. FIG. 3b shows a p−type⁻epitaxial layer 32, which is grown on n+type substrate 30 using a conventional semiconductor manufacturing technique.

In FIG. 3c, a deep $n^+$diffusion through a selected portion of p−type epitaxial layer 32, through to substrate 30, is performed using conventional masking and diffusion techniques. This $n^+$region 34 serves as the bottom plate of the capacitor array members to be subsequently formed. The region to be diffused is selected so that it lies underneath the entirety of the capacitor array. In addition, the $n^+$region serves as a low resistance path to the bottom of the wafer where physical contact is eventually made to the bottom capacitor plate and to insure that the capacitor structure that results does not vary with applied voltage (in the manner expected of a standard MOS gate transistor).

Referring to FIG. 1(c), for example, the bottom plate of capacitors $C_1$, through $C_6$ are electrically connected. For this reason and as will be shown herein, the selective incorporation of the capacitor array members is performed using the top plates of the capacitor array members.

In FIG. 3d, field oxidation is selectively performed to separate the individual capacitor array member from one another. This field oxidation is performed using conventional masking and deposition techniques. As shown next in FIG. 3e, a selective gate oxidation is performed. Gate oxide regions 38a and 38b are grown on the portions of the $n^+$region 34 that are not covered by the field oxide regions 36. These gate oxide regions 38(a) and 38(b) form the dielectric of the capacitor array elements of the programmable capacitor array. In the preferred embodiment, the dielectric is silicon dioxide ( $SiO_2$). However, the dielectric may represent a layer of silicon nitride, a silicon dioxide/silicon nitsride sandwich combination, or any other dielectric material.

Figure 3F:
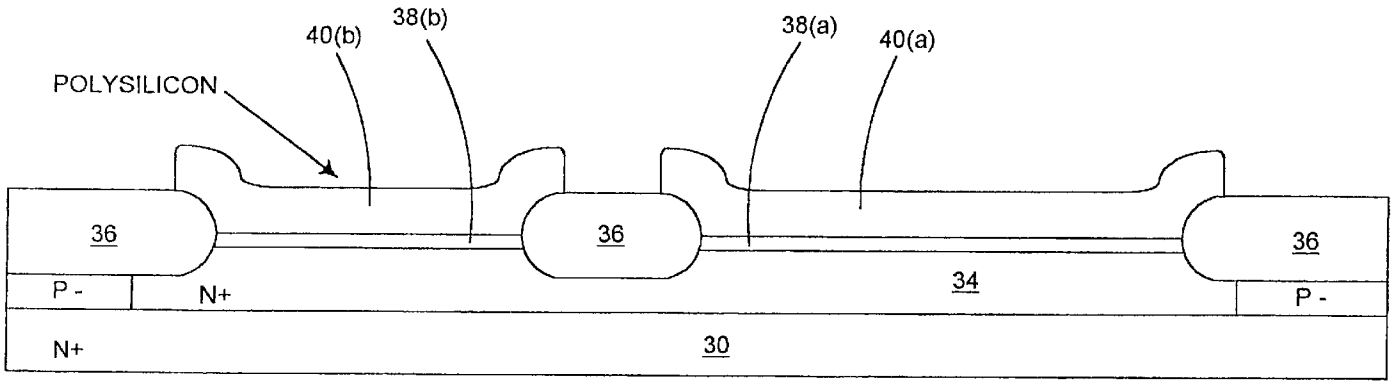

Next, a polysilicon layer is deposited and masked, as shown in FIG. 3f These polysilicon regions 40a and 40b form the top plates of the capacitor array elements associated with dielectric regions 38a and 38b.

Figure 3G:
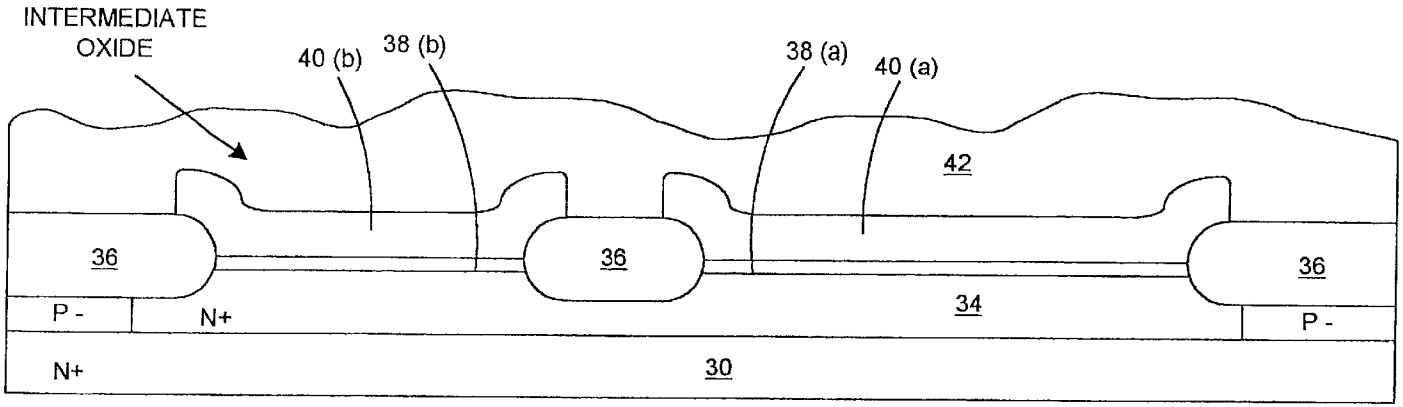

Next, an intermediate oxide layer 42 is then applied as shown in FIG. 3g. This intermediate oxide layer 42 electrically separates the individual capacitor array elements from a subsequently deposited conductive layer.

In FIG. 3g, the capacitor array is essentially "unprogrammed." At this stage, the wafer prepared in accordance with this invention may be stored until a customer's specification for a product is received. To program the capacitor of FIG. 3g to a particular desired value, the particular combination of capacitor array elements C1 . . . Cn to be incorporated into the final capacitor structure is first ascertained. For example, the desired capacitance value may be compared against a predefined table which lists the possible combinations of incorporated capacitor array elements and the capacitance values that result thereby.

To select a given capacitor array element for incorporation into the final capacitor array structure, a contact mask is employed to perform a contact etch. If a capacitor array element site is provided with a contact hole (through intermediate oxide layer 42) to facilitate electrical contact with a subsequently deposited conductive layer, that capacitor array element is selected for incorporation. On the other hand, if a capacitor array element is not provided with a contact hole through the intermediate oxide layer 42 that overlies it, no electrical contact may be formed between that capacitor array element and the subsequently deposited conductive layer. Consequently, the latter capacitor array element may be through of as being non-selected, i.e., makes no contribution (except for its parasitic capacitance) to the capacitance value of the final capacitor structure.

Figure 3H:
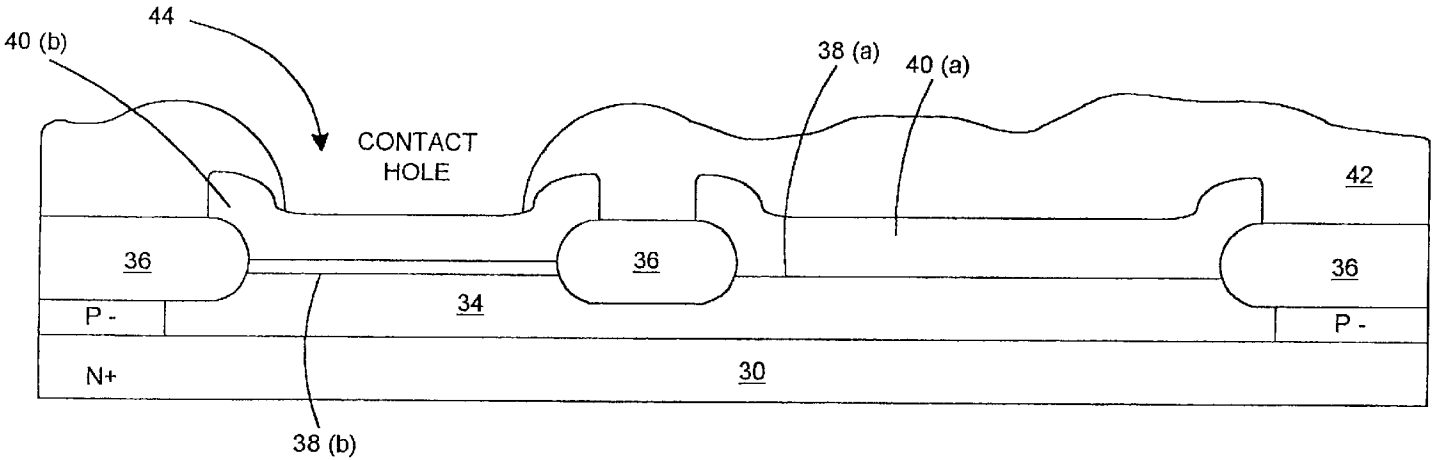
Figure 3I:
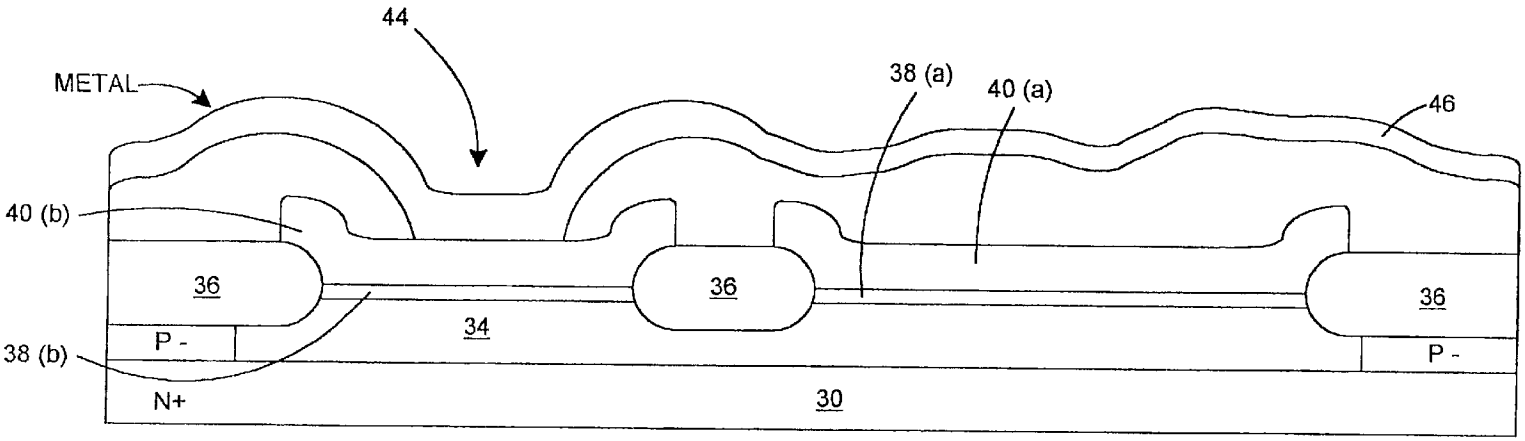

As shown in FIG. 3h, a contact hole 44 is created by etching through the intermediate oxide 42 to expose polysilicon top plate 40b. FIG. 3i shows the deposition of a metal layer 46, which makes contact with polysilicon top plate 40b through contact hole 44. This metal layer acts as a continuous top plate connected to all selected capacitor array elements, advantageously minimizing the parasitic effects of resistance and inductance.

Figure 3J:
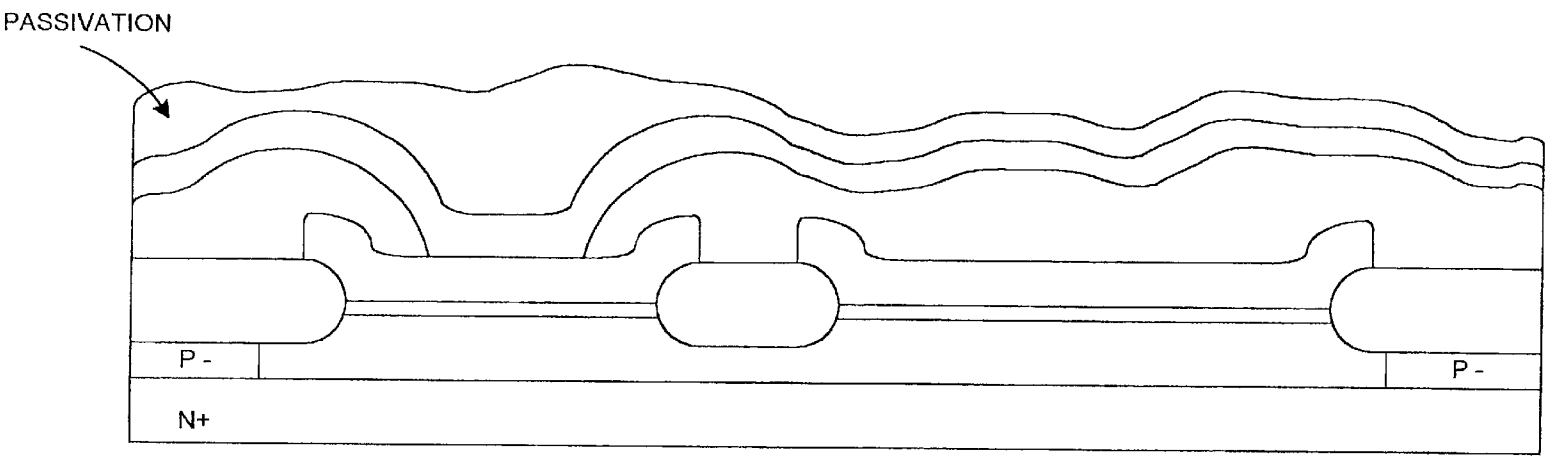

As can be seen in FIG. 3h, the capacitor array element associated with polysilicon top plate 40(b) is selected for incorporation into the final capacitor structure. In contrast, no contact hole is made with polysilicon top plate 40a, and the capacitor array element associated therewith is left decoupled from the final capacitor structure. However, there exists a parasitic capacitor consisting of two capacitors in series. The first capacitor is formed with the metal acting as the top plate, the intermediate oxide acting as the primary dielectric, and the polysilicon layer acting as the bottom plate. The second capacitor is formed with the polysilicon layer acting as the top plate, the gate oxide acting as the dielectric, and the $n^+$layer acting as the bottom plate. This parasitic capacitor, which is associated with the site of the non-selected capacitor array member, still contributes to the capacitance value of the final capacitor structure in the manner discussed in connection with FIG. 1c. In practice, the parasitic capacitance value is much smaller than the capacitance value of the normal capacitor array element typically one twentieth to one fortieth of the non-selected capacitor array member. Following the metal deposition step of FIG. 3i a passivation layer 50 is deposited in a conventional manner to protect the entire structure, as shown in FIG. 3j.

It should be emphasized that in the above discussed embodiment, the separate capacitor array elements are always present. Whether a given capacitor array element is selected for incorporation or left out of the final capacitor structure depends on whether a contact hole is provided in the intermediate oxide layer above that capacitor array element to create an electrical path to its top plate. Thus, the value of the capacitor structure that results is determined by appropriately programming the presence or absence of selected contact holes on the contact mask.

While this invention has been described in terms of several preferred embodiments, there are alterations, permutations, and equivalents which fall within the scope of this invention. By way of example, although the inventive concept has been discussed, for east of illustration, with reference to n+type substrates, n type or p type materials could be reversed in a given process implementation. Further, the present inventive concepts also apply equally well to capacitor arrays employing different types of dielectric materials, doping concentrations, as well as those not having an epitaxial layer. Additionally, although the programmability feature is facilitated through the use of a contact mask in this discussion, it should be borne in mind that a programmable passive device may be facilitated through the use of the metal mask, the via mask between metal 1 and metal 2 layers, poly mask, active mask, and the like. As a further example, the inventive concepts discussed herein are also applicable to passive devices (such as capacitors, resistors, inductors, and the like) which are integrated with active components (such as transistors, diodes, and the like) on the same integrated circuit. It should also be noted that there are many other alternative ways of implementing the methods and apparatuses of the present invention. It is therefore intended that the specification herein be interpreted as including all such alterations, permutations, and equivalents as fall within the true spirit and scope of the present invention.

What is claimed is:

1. A method for endowing an integrated passive device array structure with a programmable value during manufacturing, comprising:

forming a substantially conductive first layer;

forming a plurality of integrated passive device array elements of said integrated passive device array structure above said substantially conductive first layer, *wherein some of the integrated passive array elements have a first value and others have a second value wherein the first value and the second value are different*;

forming an insulating layer above said plurality of passive device array elements; and;

selectively forming vias in said insulating layer, said vias facilitating electric connection between selected ones of said plurality of passive device array elements with a substantially conductive second layer subsequently deposited above said insulating layer, thereby programming a *pre-selected* value into the integrated passive device array structure.

2. The method of claim 1 wherein said plurality of passive device array elements represent capacitors.

3. The method of claim 2 wherein said capacitors have dielectric portions formed in an oxide layer, said oxide layer being disposed between said substantially conductive first layer and said insulating layer.

4. The method of claim 3 wherein areas of said dielectric portions are selected to permit values of said plurality of said passive device array elements to relate to one another in a binary manner.

5. The method of claim 1 wherein said selectively formning vias including selecting an appropriate mask to etch through said insulating layer.

6. A method for forming an integrated passive device array structure having a programmable value, comprising:

forming a substantially conductive first layer;

electrically coupling said substantially conductive first layer with a plurality of passive device array elements of said integrated passive device array structure, said plurality of passive device array elements being disposed above said substantially conductive first layer; and electrically coupling selected ones of said plurality of passive device array elements with a substantially conductive second layer formed above said passive device array element to form said integrated passive device array structure, said selected ones of said plurality of passive device array elements representing a subset of said plurality of passive device array elements, thereby programming a value into the integrated passive device array structure.

7. The method of claim 6 wherein a value of said integrated passive device array structure is substantially determined by an aggregate of values of said selected ones of said plurality of passive device array elements.

8. The method of claim 6 wherein said selected ones of said plurality of passive device array elements are configured to be electrically coupled in parallel between said substantially conductive first layer and said substantially conductive second layer.

9. The method of claim 6 further comprising forming said plurality of passive device array elements above said substantially conductive first layer, including forming individual ones of said plurality of passive device array elements, values of said individual ones of said plurality of passive device array elements being related in a binary manner.

10. The method of claim 6 further comprising forming said plurality of passive device array elements above said substantially conductive first layer, including forming individual ones of said plurality of passive device array elements in an oxide layer, said oxide layer being disposed between said substantially conductive first layer and said substantially conductive second layer.

11. The method of claim 10 further comprising:

forming an insulating layer above said oxide layer; and furnishing each of said selected ones of said plurality of passive device array elements with a via through said insulating layer to permit said substantially conductive second layer to electrically couple with said each of said selected ones of said plurality of passive device array elements.

12. The method of claim 11 wherein at least one of said plurality of passive device elements is selected to be electrically decoupled from said substantially conductive second layer.

13. The method of claim 11 wherein said plurality of passive device array elements represent capacitors.

14. A method of forming a programmed integrated capacitor during manufacturing, the method comprising:

forming a substantially conductive first layer;

forming a plurality of integrated capacitor elements to create an integrated capacitor array structure, each of the integrated capacitor elements being electrically connected to the substantially conductive first layer;

forming an insulating layer that electrically isolates the plurality of integrated capacitor elements;

forming a substantially conductive second layer;

electrically coupling a selected number of the integrated capacitor elements to the substantially conductive to program a capacitance value into the integrated capacitor array structure.

* * * * *